United States Patent
Hou

(10) Patent No.: US 10,139,863 B2
(45) Date of Patent: Nov. 27, 2018

(54) STRUCTURE AND METHOD FOR PREVENTING TERMINAL SCREEN FROM BEING DAMAGED DURING FALLING

(71) Applicant: ZTE CORPORATION, Guangdong (CN)

(72) Inventor: Fangxi Hou, Guangdong (CN)

(73) Assignee: ZTE CORPORATION, Guangdong (CN)

( * ) Notice: Subject to any disclaimer, the term of this patent is extended or adjusted under 35 U.S.C. 154(b) by 0 days.

(21) Appl. No.: 15/532,529

(22) PCT Filed: Sep. 2, 2015

(86) PCT No.: PCT/CN2015/088895
§ 371 (c)(1),
(2) Date: Jun. 2, 2017

(87) PCT Pub. No.: WO2016/086696
PCT Pub. Date: Jun. 9, 2016

(65) Prior Publication Data
US 2017/0351302 A1    Dec. 7, 2017

(30) Foreign Application Priority Data
Dec. 4, 2014   (CN) .................... 2014 2 0758010 U

(51) Int. Cl.
*G06F 1/16*    (2006.01)
*H04M 1/02*    (2006.01)
(Continued)

(52) U.S. Cl.
CPC .............. *G06F 1/1658* (2013.01); *G06F 1/16* (2013.01); *H04M 1/026* (2013.01);
(Continued)

(58) Field of Classification Search
CPC ............................ G06F 1/1626; G06F 1/1656
See application file for complete search history.

(56) References Cited

U.S. PATENT DOCUMENTS 7,059,182 B1 *   6/2006   Ragner ................ H05K 5/0086
                                                        73/200
8,330,305 B2 *  12/2012   Hart ...................... H04M 1/185
                                                        267/136
(Continued)

FOREIGN PATENT DOCUMENTS

CN           204374822 U        6/2015

OTHER PUBLICATIONS

International Search Report dated Dec. 15, 2015 issued in PCT/CN2015/088895.

*Primary Examiner* — Anthony Q Edwards
(74) *Attorney, Agent, or Firm* — Scully Scott Murphy & Presser

(57) ABSTRACT

A structure for preventing a terminal screen from being damaged during falling comprises a terminal body, and an air channel and a sensor that are disposed in the terminal body. A fan is disposed in the air channel. The sensor is electrically connected to the fan by using a main control chip in the terminal body. The sensor can receive a signal indicating that the terminal body falls to the ground and control the fan to be turned on or turned off by using the main control chip. An air inlet and an air outlet are respectively formed at two ends of the air channel. The air outlet of the air channel is formed on the terminal body. The structure can relieve a force generated when the terminal screen hits the ground during falling.

20 Claims, 2 Drawing Sheets

(51) Int. Cl.
*H05K 7/14* (2006.01)
*H05K 7/20* (2006.01)
*H04M 1/18* (2006.01)
*H04M 1/725* (2006.01)

(52) U.S. Cl.
CPC ....... *H05K 7/1484* (2013.01); *H05K 7/20145* (2013.01); *H04M 1/18* (2013.01); *H04M 1/72569* (2013.01); *H04M 2250/12* (2013.01)

(56) References Cited

U.S. PATENT DOCUMENTS

| | | | |
|---|---|---|---|
| 8,862,182 B2* | 10/2014 | Shukla | H02K 41/0356 |
| | | | 340/439 |
| 9,116,668 B2* | 8/2015 | Xiaozhuo | G06F 1/1656 |
| 9,571,150 B2* | 2/2017 | Sanford | H04B 1/3888 |
| 2002/0079746 A1 | 6/2002 | Hashimoto | |
| 2010/0164152 A1* | 7/2010 | Li | F16F 15/067 |
| | | | 267/140.15 |
| 2011/0194230 A1* | 8/2011 | Hart | H04M 1/185 |
| | | | 361/437 |
| 2013/0257582 A1* | 10/2013 | Rothkopf | G06F 1/1656 |
| | | | 340/3.1 |
| 2015/0331456 A1* | 11/2015 | Moon | G06F 1/1656 |
| | | | 361/51 |

\* cited by examiner

STRUCTURE AND METHOD FOR PREVENTING TERMINAL SCREEN FROM BEING DAMAGED DURING FALLING

CROSS-REFERENCE TO RELATED APPLICATION

This application is the 371 application of PCT Application No. PCT/CN2015/088895, filed Sep. 2, 2015, which is based upon and claims priority to Chinese Patent Application No. 201420758010.7, filed Dec. 4, 2014, the entire contents of which are incorporated herein by reference.

TECHNICAL FIELD

The present disclosure relates to, but is not limited to, a terminal, and more particularly, to a structure and method for preventing a terminal screen from being damaged during falling and a computer readable storage medium.

BACKGROUND

For terminals on the market, the phenomenon of damaging their screens due to falling (dropping) often occurs. At present, the protection solution during falling of the terminal screen is to design a spring, a plastic or rubber part higher than a horizontal plane of the screen on the screen panel of the terminal for protection, and to avoid the screen to directly touch with the ground and thus be damaged. However, by using this solution, since a protection part is added on the screen panel of the terminal, an appearance of the terminal is affected, a thickness of the terminal is increased, and the user experience is reduced.

This section provides background information related to the present disclosure which is not necessarily prior art.

SUMMARY

The following is a summary of topics that are described in detail in this disclosure. This summary is not intended to limit the protection scope of the claims.

The present disclosure provides a structure for preventing a terminal screen from being damaged during falling, which can slow down the impact of the terminal screen on the ground when falling and enhance the user experience.

The embodiments of the present disclosure provide a structure for preventing a terminal screen from being damaged during falling, including: a terminal body, and an air duct and a sensor provided within the terminal body, wherein the air duct is provided with a fan therein, the sensor is electrically connected to the fan via a main control chip within the terminal body, the sensor is capable of receiving a signal indicating that the terminal body falls towards a ground and controlling a switch of the fan through the main control chip, two ends of the air duct are respectively provided with an air inlet and an air outlet, and the air outlet of the air duct is provided on the terminal body.

Alternatively, the air outlet of the air duct is provided on a screen panel of the terminal body; and the signal indicating that the terminal body falls towards the ground, includes:

a signal indicating that the screen panel of the terminal body falls toward the ground.

Alternatively, the air outlet of the air duct is provided on a backplane of the terminal body; and the signal indicating that terminal body fails towards the ground, includes:

a signal indicating that the backplane of the terminal body falls toward the ground.

Alternatively, the air inlet of the air duct is a headphone port and/or a USB charging port of the terminal body.

Alternatively, the air outlet of the air duct is located in a sound hole of a handset and/or a speaker of the terminal body.

Alternatively, the air outlet of the air duct is provided on one side of the screen panel of the terminal body.

Alternatively, the air outlet of the air duct is provided on both sides of the screen panel of the terminal body.

Alternatively, the air outlet of the air duct is provided on one side of the backplane of the terminal body.

Alternatively, the air outlet of the air duct is provided on both sides of the backplane of the terminal body.

Alternatively, the air duct is a closed passage.

Alternatively, the air outlet of the air duct is provided with a filter.

Alternatively, sound holes of a handset and a speaker are respectively provided at an upper side frame and a lower side frame of a screen panel of the terminal body, both the sound holes of the handset and the speaker are provided with the air outlet therein, the air outlet in the sound hole of the handset is communicated with a headphone port provided on a top surface of the terminal body through the air duct, and the air outlet in the sound hole of the speaker is communicated with a USB charging port provided on a bottom surface of the terminal body through the air duct.

Alternatively, the fan is connected to a power source in the terminal body.

Alternatively, the sensor is an acceleration sensor, a geomagnetism sensor, an angular velocity sensor, or a displacement sensor.

The embodiments of the present disclosure provide a method for preventing a terminal screen from being damaged during falling, including:

detecting a falling signal of a terminal;

determining a falling posture of the terminal based on the detected falling signal; and controlling an air outlet of the terminal to blow air according to the falling posture.

The controlling the air outlet of the terminal to blow air according to the falling posture includes:

determining an air outlet facing the ground when the terminal is in the falling posture according to the falling posture, and blowing air from the determined air outlet facing the ground.

Alternatively, one or more air outlets are provided on a screen panel of the terminal.

Alternatively, the air outlet of the terminal is provided in a sound hole of a handset and/or a speaker of the terminal.

Alternatively, when a plurality of air outlets are provided on the screen panel of the terminal, the plurality of air outlets are provided on the same side of the screen panel; or the plurality of air outlets are provided on different sides of the screen panel.

Alternatively, the controlling the air outlet of the terminal to blow air according to the falling posture, includes:

when the falling posture indicates that a screen panel of the terminal faces the ground, blowing air from the one or more air outlets.

Alternatively, one or more air outlets are provided on a backplane of the terminal.

Alternatively, when a plurality of air outlets are provided on the backplane of the terminal, the plurality of air outlets are provided on the same side of the backplane; or the plurality of air outlets are provided on different sides of the backplane.

The controlling the air outlet of the terminal to blow air according to the falling posture, includes:

when the falling posture indicates that a backplane of the terminal faces the ground, blowing air from the one or more air outlets provided on the screen panel.

The embodiments of the present disclosure further provide a computer-readable storage medium storing program instructions to implement the method for preventing a terminal screen from being damaged during falling provided by the embodiments of the present disclosure when the program instructions are executed.

The advantageous effects of the embodiments of the present disclosure are as follows.

1. In the embodiments of the present disclosure, an air duct and a fan are provided in a terminal body, and an air outlet is provided on the terminal body. When the terminal is falling toward the ground, the falling is sensed by the sensor on the terminal, and the fan is enabled to blow air, thereby relieving an impact force of the terminal with the ground.

2. In the embodiments of the present disclosure, the earphone port and the USB charging port on the terminal body are designed as the air inlets of the air duct, and the sound holes of the handset and the speaker on the terminal body are designed as the air outlets of the air duct, so it is convenient to make improvements on the basis of the structure of the original terminal.

3. In the embodiments of the present disclosure, the air outlet of the air duct is arranged on one side frame of the screen panel of the terminal body, and when the terminal falls with the screen facing the ground, the air outlet blows air and the terminal body can be turned over under the action of the wind, thereby preventing the screen from directly colliding with the ground.

4. In the embodiments of the present disclosure, the air outlet of the air duct is arranged on both side frames of the screen panel of the terminal body, thereby increasing the wind power of the air outlet, and effectively reducing the impact of colliding with the ground by the terminal screen.

After reading and understanding the drawings and detailed description, other aspects may be understood.

This section provides a summary of various implementations or examples of the technology described in the disclosure, and is not a comprehensive disclosure of the full scope or all features of the disclosed technology.

DETAILED DESCRIPTION

Figure 1:
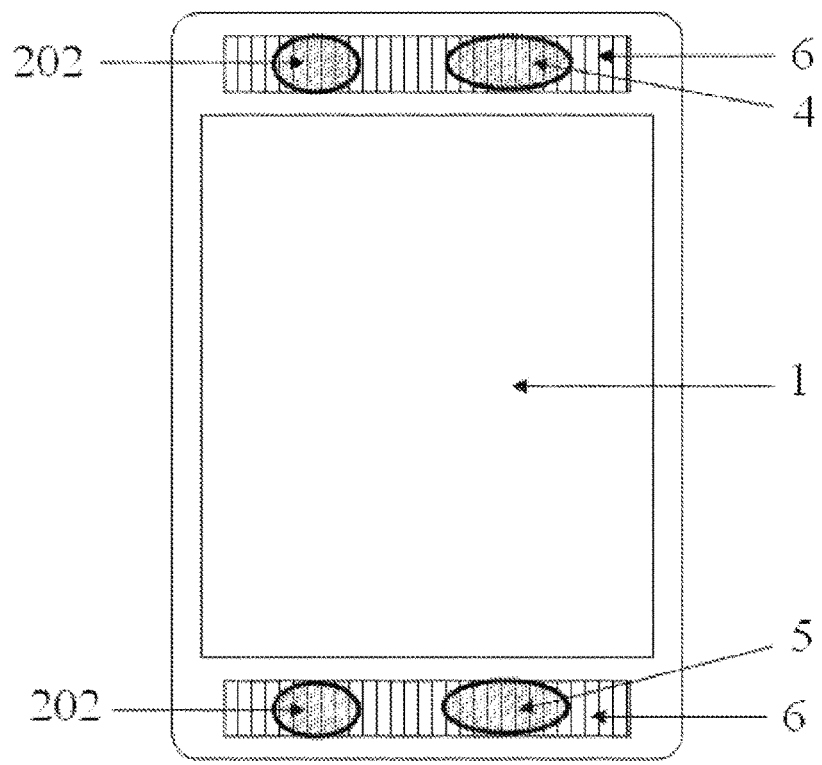
FIG. 1 is a schematic structural view of a first embodiment of the present disclosure.
Figure 2:
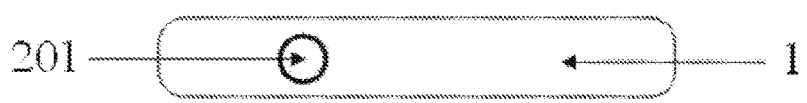
FIG. 2 is a top view of the first and second embodiments of the present disclosure.
Figure 3:
FIG. 3 is a bottom view of the first and second embodiments of the present disclosure.
Figure 4:
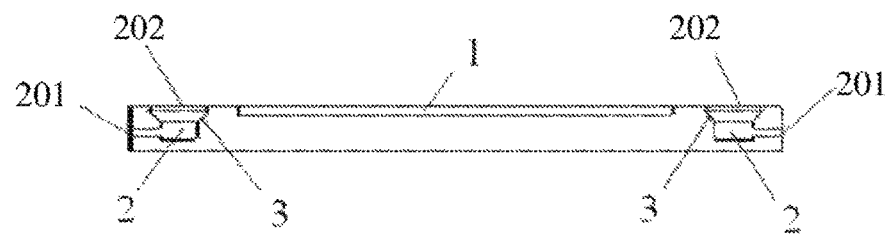
FIG. 4 is a cross-sectional view of the first and second embodiments of the present disclosure.

For making the purpose, technical solutions and advantages of the embodiments of the present disclosure more clear, the embodiments of the present disclosure will be described in detail hereinafter with reference to the accompanying drawings. It is to be noted that the embodiments and the features in the embodiments of the present disclosure may be combined with each other without conflict.

First Embodiment

As shown in FIGS. 1, 2, 3 and 4, a structure for preventing a terminal screen from being damaged during falling includes a terminal body 1, and an air duct 2 provided in the terminal body 1. The air duct 2 is a hermetically sealed channel, and an air inlet 201 and an air outlet 202 are respectively provided at two ends of the air duct 2. A fan 3 is provided in the air duct 2. The fan 3 is connected to a power source in the terminal body 1. The air outlet 202 of the air duct is provided on a screen panel of the terminal body 1. A sensor is provided in the terminal body 1. The sensor may be an acceleration sensor, a geomagnetic sensor, an angular velocity sensor or a displacement sensor for sensing a position of a mobile phone. The sensor is electrically connected to the fan 3 through a main control chip in the terminal body 1. When the terminal screen falls to the ground, the sensor senses the acceleration or position change of the terminal falling to the ground. The fan 3 is turned on by the main control chip in the terminal body 1, so that the terminal screen blows air towards the ground. Under the counter-acting force of wind, the impact of the terminal screen colliding with the ground is slowed down.

Alternatively, it is also possible to only provide one air duct 2, and one corresponding air inlet 201 and one air outlet 202.

Second Embodiment

As shown in FIGS. 1, 2, 3 and 4, a structure for preventing a terminal screen of a mobile phone from being damaged during falling includes a terminal body 1, sound holes 6 of a handset 4 and a speaker 5 are provided respectively on upper and lower side frames of the screen panel of the terminal body 1. The top surface and the bottom surface of the terminal body 1 are respectively provided with a headphone port and a USB charging port, and two air ducts 2 are provided in the terminal body 1, both of which are provided with a fan 3 therein. The air inlets 201 of the two air ducts 2 are a headphone port and a USB charging port, respectively. The air outlets 202 of the two air ducts 2 are provided in the sound holes 6 of the handset 4 and the speaker 5, respectively. The air outlet 202 in the sound hole 6 of the handset 4 communicates with the headphone port provided on the top surface of the terminal body via the air duct, and the air outlet 202 in the sound hole 6 of the speaker 5 communicates with the USB charging port provided on the bottom surface of the terminal body through the air duct. The air outlet 202 is provided with a filter, and a sensor is provided in the terminal body 1. The sensor is electrically connected to the fan 3 through the main control chip in the terminal body 1 and controls turn-on or turn-off of the fan 3 through the main control chip in the terminal body 1. The sensor is an acceleration sensor, and may sense the acceleration of the terminal body 1 in three directions of x-axis, y-axis, and z-axis. The acceleration in the z-axis direction sensed by the sensor is an acceleration in a direction perpendicular to a direction of a screen panel of the terminal body 1. When the terminal body 1 falls with the screen panel facing the ground, the acceleration sensor may sense the acceleration in the z-axis direction, thereby turning on the fan 3 in the terminal body 1, so that the sound holes 6 on the upper and lower sides of the terminal body 1 blow air, to slow down the impact of the terminal screen with the ground.

Alternatively, it is also possible to only provide one air duct 2, and one corresponding air inlet 201 and one air outlet 202.

Third Embodiment

In another alternative embodiment, on the basis of the above embodiment, the air outlet 202 of the air duct 2 may be provided on one side of the terminal body 1, that is, on one side of the screen panel of the terminal body 1. The one side of the screen panel may be an upper side, a lower side, a left side, or a right side of the screen panel. When the structure includes two air outlets 202, the two air outlets are provided on the same side of the screen panel of the terminal body 1. When the terminal body 1 falls with the screen panel toward the ground, the fan 3 in the terminal body 1 is started to blow wind on the side of the screen panel of the terminal body 1 so that the terminal body 1 is turned at an angle to prevent the screen panel of the terminal body 1 from colliding with the ground surface vertically, and reduce the impact of the terminal screen hitting the ground.

Alternatively, it is also possible to only provide one air duct 2, and one corresponding air inlet 201 and one air outlet 202.

Fourth Embodiment

Figure 5:
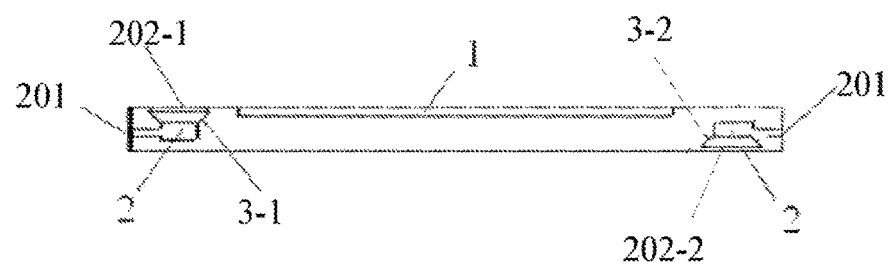
FIG. 5 is a cross-sectional view of a fourth embodiment of the present disclosure.
Figure 6:
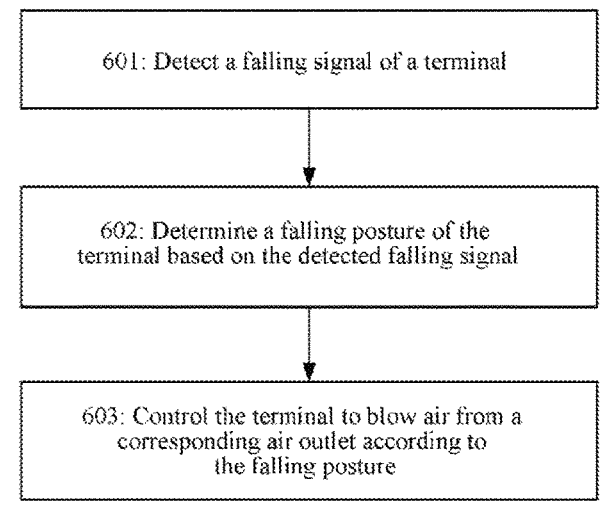
FIG. 6 is a flow chart of a fifth embodiment of the present disclosure.

As shown in FIG. 5, a structure for preventing a terminal screen from being damaged during falling includes a terminal body 1, and an air duct 2 provided in the terminal body 1. The air duct 2 is a closed passage, and an air inlet 201 and an air outlet 202-1, and an air inlet 201 and an air outlet 202-2 are respectively provided at both ends of the duct 2. The air duct 2 is provided with fans 3-1 and 3-2 therein. The fans are connected to a power source in the terminal body 1. The air outlet 202-1 of the air duct is provided on the screen panel of the terminal body 1, and the air outlet 202-2 of the air duct is provided on a backplane of the terminal body 1. The terminal body 1 is provided with a sensor therein, and the sensor may be an acceleration sensor, a geomagnetism sensor, an angular velocity sensor or a displacement sensor for sensing a position of a mobile phone. The sensor is electrically connected with the fans 3-1, 3-2 through the main control chip in the terminal body 1, and when the terminal falls to the ground, the sensor feels the acceleration or position change of the terminal falling to the ground. When it is determined that the terminal falls with the screen panel facing the ground, the fan 3-1 is controlled to be turned on by the main control chip in the terminal body 1 to blow air from the air outlet 202-1, so that the terminal screen blows air in a direction of facing the ground, and under the counter-acting force of the wind, the impact of the terminal screen hitting the ground is reduced. When t is determined that the terminal falls with the backplane facing the ground, the fan 3-2 is controlled to be turned on by the main control chip in the terminal body 1 to blow air from the air outlet 202-2, so that the terminal blows air in a direction opposite to the ground, and under the counter-acting force of the wind, the impact of the terminal screen hitting the ground is reduced.

Fifth Embodiment

A method for preventing a terminal screen from being damaged during falling includes the following steps.

In step 601, a falling signal of a terminal is detected.

In step 602, a falling posture of the terminal is determined based on the detected falling signal.

In step 603, according to the falling posture, the terminal is controlled to blow air from a corresponding air outlet.

In step 603, the terminal is controlled to blow air from the corresponding air outlet according to the falling posture, which includes:

determining an air outlet facing the ground when the terminal is in the falling posture according to the falling posture, and blowing air from the determined air outlet facing the ground. That is, the fan at the corresponding position in the terminal is controlled to be started, and accordingly the air is blown from the air outlet facing the ground when the terminal is falling. At this point, when the terminal approaches the ground, the wind from the air outlet blows to the ground and generates a counter-acting force, which can slow down the impact force when the terminal collides with the ground.

Optionally, one or more air outlets are provided on a screen panel of the terminal; or one or more air outlets are provided on a backplane of the terminal; or one or more air outlets are provided on the panel or backplane of the terminal respectively.

Optionally, the air outlet of the terminals provided in a sound hole of a handset and/or a speaker of the terminal.

Optionally, when a plurality of air outlets are provided on the screen panel of the terminal, the plurality of air outlets may be provided on the same side of the screen panel; or the plurality of air outlets may be provided on different sides of the screen panel.

Optionally, when one or more air outlets are provided on the screen panel of the terminal, the air outlet of the terminal is controlled to blow air according to the falling posture, which includes:

when the falling posture indicates that the screen panel of the terminal faces the ground, blowing air from the one or more outlets provided on the screen panel.

Optionally, when one or more air outlets are provided on the backplane of the terminal, the air outlet of the terminal is controlled to blow air according to the falling posture, which includes:

when the falling posture indicates that the backplane of the terminal faces the ground, blowing air from the one or more air outlets provided on the backplane.

Optionally, when one or more air outlets are provided on the screen panel of the terminal and one or more air outlets are provided on the backplane of the terminal, the air outlet of the terminal is controlled to blow air according to the falling posture, which includes:

when the falling posture indicates that the screen panel of the terminal faces the ground, blowing air from one or more outlets on the screen panel of the terminal; and when the falling posture indicates that the backplane of the terminal faces the ground, blowing air from one or more air outlets on the backplane of the terminal.

In step 601, a sensor provided in the terminal may be used to detect a falling signal of the terminal. The sensor may be an acceleration sensor, a geomagnetic sensor, an angular velocity sensor or a displacement sensor for sensing the position of the terminal. When the terminal falls to the ground, the sensor senses the acceleration or position change of the terminal to the ground, that is, detects the falling signal of the terminal correspondingly. The manner for detecting the falling signal of the terminal is not limited to the manner exemplified in the present embodiment.

Sixth Embodiment

The embodiments of the present disclosure also provide a computer readable storage medium storing program instructions which, when executed by the processor, may implement a method for preventing a terminal screen from being damaged during falling provided by the fifth embodiment of the present disclosure.

It will be understood by those skilled in the art that all or a portion of the steps of the embodiments described above may be implemented using flows of a computer program that may be stored in a computer readable storage medium and be executed on a corresponding hardware platform (such as a system, equipment, an apparatus, and a device). When being executed, one of the steps or a combination of the steps in the method embodiment is included.

Alternatively, all or a portion of the steps of the embodiments described above may also be implemented using an integrated circuit. These steps may be implemented by being separately made into individual integrated circuit modules, or making a plurality of modules or steps into a single integrated circuit module.

The devices/functional modules/functional units in the above embodiments may be implemented using a general purpose computing device, which may be embodied on a single computing device or may be distributed over a network consisting of a plurality of computing devices.

The devices/functional modules/functional units in the above embodiments may be stored in a computer-readable storage medium when being implemented in the form of software function modules and sold or used as a stand-alone product. The above-mentioned computer-readable storage medium may be a read-only memory, a disk or an optical disk.

INDUSTRIAL APPLICABILITY

The embodiments of the present disclosure realize an air-out structure on the terminal body, and achieve the goal of reducing an impact force between the terminal and the ground by using the wind when the terminal falls to the ground.

What is claimed is:

1. A structure for preventing a terminal screen from being damaged during falling, comprising a terminal body, and an air duct and a sensor provided within the terminal body, wherein the air duct is provided with a fan therein, the sensor is electrically connected to the fan via a main control chip within the terminal body, the sensor is capable of receiving a signal indicating that the terminal body falls towards a ground and controlling a switch of the fan through the main control chip, two ends of the air duct are respectively provided with an air inlet and an air outlet, and the air outlet of the air duct is provided on the terminal body.

2. The structure for preventing the terminal screen from being damaged during falling of claim 1, wherein the air outlet of the air duct is provided on a screen panel of the terminal body; and
the signal indicating that the terminal body falls towards the ground, comprises:
a signal indicating that the screen panel of the terminal body falls toward the ground.

3. The structure for preventing the terminal screen from being damaged during falling of claim 1, wherein the air inlet of the air duct is a headphone port and/or a USB charging port of the terminal body.

4. The structure for preventing the terminal screen from being damaged during falling of claim 1, wherein the air outlet of the air duct is located in a sound hole of a handset and/or a speaker of the terminal body.

5. The structure for preventing the terminal screen from being damaged during falling of claim 1, wherein the air outlet of the air duct is provided on one side of the screen panel of the terminal body.

6. The structure for preventing the terminal screen from being damaged during falling of claim 1, wherein the air outlet of the air duct is provided on both sides of the screen panel of the terminal body.

7. The structure for preventing the terminal screen from being damaged during falling of claim 1, wherein the air duct is a closed passage.

8. The structure for preventing the terminal screen from being damaged during falling of claim 1, wherein the air outlet of the air duct is provided with a filter.

9. The structure for preventing the terminal screen from being damaged during falling of claim 1, wherein sound holes of a handset and a speaker are respectively provided at an upper side frame and a lower side frame of a screen panel of the terminal body, both the sound holes of the handset and the speaker are provided with the air outlet therein, the air outlet in the sound hole of the handset is communicated with a headphone port provided on a top surface of the terminal body through the air duct, and the air outlet in the sound hole of the speaker is communicated with a USB charging port provided on a bottom surface of the terminal body through the air duct.

10. The structure for preventing the terminal screen from being damaged during falling of claim 1, wherein the fan is connected to a power source in the terminal body.

11. The structure for preventing the terminal screen from being damaged during falling of claim 1, wherein the sensor comprises an acceleration sensor, a geomagnetism sensor, an angular velocity sensor, or a displacement sensor.

12. A method for preventing a terminal screen from being damaged during falling, the method being applied in a terminal, wherein the terminal comprises a terminal body, and an air duct and a sensor provided within the terminal body, wherein the air duct is provided with a fan therein, the sensor is electrically connected to the fan via a main control chip within the terminal body, the sensor is capable of receiving a signal indicating that the terminal body 7 falls towards a ground and controlling a switch of the fan through the main control chip, two ends of the air duct are respectively provided with an air inlet and an air outlet, and the air outlet of the air duct is provided on the terminal body, the method comprising:
detecting a falling signal of the terminal;
determining a falling posture of the terminal based on the detected falling signal; and
controlling the terminal to blow air from the air outlet according to the falling posture.

13. The method of claim 12, wherein controlling the air outlet of the terminal to blow air according to the falling posture comprises:
determining an air outlet facing the ground when the terminal is in the falling posture according to the falling posture, and blowing air from the determined air outlet facing the ground.

14. The method of claim 12, wherein
one or more air outlets are provided on a screen panel of the terminal.

15. The method of claim 14, wherein when a plurality of air outlets are provided on the screen panel of the terminal,
the plurality of air outlets are provided on the same side of the screen panel; or
the plurality of air outlets are provided on different sides of the screen panel.

16. The method of claim 15, wherein the controlling the air outlet of the terminal to blow air according to the falling posture, comprises:
when the falling posture indicates that a screen panel of the terminal faces the ground, blowing air from the one or more air outlets provided on the screen panel.

17. The method of claim 14, wherein the controlling the air outlet of the terminal to blow air according to the falling posture, comprises:
when the falling posture indicates that a screen panel of the terminal faces the ground, blowing air from the one or more air outlets provided on the screen panel.

18. The method of claim 12, wherein
the air outlet of the terminal is provided in a sound hole of a handset and/or a speaker of the terminal.

19. The method of claim 18, wherein the controlling the air outlet of the terminal to blow air according to the falling posture, comprises:
when the falling posture indicates that a screen panel of the terminal faces the ground, blowing air from the one or more air outlets provided on the screen panel.

20. A computer-readable storage medium storing program instructions to implement the following steps in a terminal when the program instructions are executed in the terminal, wherein the terminal comprises a terminal body, and an air duct and a sensor provided within the terminal body, wherein the air duct is provided with a fan therein, the sensor is electrically connected to the fan via a main control chip within the terminal body, the sensor is capable of receiving a signal indicating that the terminal body falls towards a ground and controlling a switch of the fan through the main control chip, two ends of the air duct are respectively provided with an air inlet and an air outlet, and the air outlet of the air duct is provided on the terminal body, the steps comprising:
detecting a falling signal of the terminal;
determining a falling posture of the terminal based on the detected falling signal; and
controlling the terminal to blow air from the air outlet according to the falling posture.

* * * * *